United States Patent
Yamaguchi et al.

(10) Patent No.: US 7,841,869 B2
(45) Date of Patent: Nov. 30, 2010

(54) CONNECTOR FOR BOARD AND ELECTRICAL JUNCTION BOX

(75) Inventors: Jun Yamaguchi, Yokkaichi (JP); Kouichi Takagi, Yokkaichi (JP)

(73) Assignee: Sumitomo Wiring Co., Ltd., Mie (JP)

( * ) Notice: Subject to any disclaimer, the term of this patent is extended or adjusted under 35 U.S.C. 154(b) by 7 days.

(21) Appl. No.: 12/292,263

(22) Filed: Nov. 14, 2008

(65) Prior Publication Data

US 2009/0137135 A1 May 28, 2009

(30) Foreign Application Priority Data

Nov. 26, 2007 (JP) .............................. 2007-304821

(51) Int. Cl.
*H01R 12/00* (2006.01)
(52) U.S. Cl. ...................... 439/76.1; 439/589
(58) Field of Classification Search ................ 439/76.1, 439/595, 599, 375, 79
See application file for complete search history.

(56) References Cited

U.S. PATENT DOCUMENTS

| | | | | |
|---|---|---|---|---|
| 2,669,702 A | * | 2/1954 | Klostermann | 439/676 |
| 4,984,973 A | * | 1/1991 | Itameri-Kinter et al. | 417/422 |
| 5,344,342 A | * | 9/1994 | Briones | 439/620.12 |
| 5,571,033 A | * | 11/1996 | Kinsey et al. | 439/595 |
| 5,632,639 A | * | 5/1997 | Hayashi | 439/271 |
| 5,921,789 A | * | 7/1999 | Makino et al. | 439/79 |
| 6,068,494 A | * | 5/2000 | Tokuwa | 439/79 |
| 6,491,542 B1 | * | 12/2002 | Zerebilov | 439/489 |
| 6,808,397 B2 | * | 10/2004 | Kondo | 439/76.2 |
| 7,134,910 B2 | | 11/2006 | Nakano et al. | |
| 7,736,158 B2 | * | 6/2010 | Yamaguchi | 439/76.2 |

FOREIGN PATENT DOCUMENTS

JP A-05-326049 12/1993

* cited by examiner

*Primary Examiner*—Neil Abrams
*Assistant Examiner*—Phuong Nguyen
(74) *Attorney, Agent, or Firm*—Oliff & Berridge, PLC

(57) ABSTRACT

A connector for a board and an electrical junction box that utilizes the connector are provided. The connector prevents adjacent terminal metals from causing a short circuit. Each connector housing includes a hood section having an inner wall. Protrusions are provided on an outer surface of each inner wall to project outward in a thickness direction of the inner wall. Openings around adjacent through-holes are shifted in the thickness direction of the inner wall. Thus, it is possible to increase a distance on surface between adjacent terminal metals inserted into the adjacent through-holes. The distance on the surface between adjacent terminal metals prevents water adhering to the terminals metals from short-circuiting the adjacent terminal metals.

12 Claims, 7 Drawing Sheets

CONNECTOR FOR BOARD AND ELECTRICAL JUNCTION BOX

This application claims priority from Japanese Patent Application No. 2007-304821 filed in the Japanese Patent Office on Nov. 26, 2007, the entire disclosure of which is hereby incorporated by reference in its entirety.

BACKGROUND

1. Technical Field

This invention relates to a connector for a board and an electrical junction box provided with the connector for the board.

2. Background Art

Heretofore, a connector for a board has been known, as disclosed in JP HEI 5 (1993)-326049 A (hereinafter "Patent Document 1"). This connector for a board comprises a connector housing including a hood section adapted to be coupled to a mating connector, and a plurality of terminal metals disposed in the connector housing and passing through an inner wall of the hood section to be spaced away from each other. An end of each terminal metal is disposed within the hood section while the other end of each terminal metal is connected to a circuit board. The other end is electrically connected to electrically conductive paths formed on the circuit board by a printed wiring technique.

SUMMARY

Problems that the Invention is to Solve

In the case where a circuit board provided with a connector for a board is applied to an electrical junction box, there is a possibility that adjacent terminal metals may cause a short circuit on account of the following reasons.

The above electrical junction box contains a circuit board in a casing. The above connector for the board is disposed on the circuit board. In the case where the electrical junction box is mounted on, for example, an engine compartment of a motor vehicle, there will be a fear that water will enter the casing upon rainfalls or vehicle-washing. There is also a fear that a dew formation will occur in the casing on account of a difference in temperature between a stopping mode and a running mode of a motor vehicle. Consequently, the water in the casing will flow along an outer side surface of an inner wall and will adhere to adjacent terminal metals disposed on the inner wall to bridge the adjacent terminal metals.

Since an electrical resistance between the adjacent terminal metals becomes relatively great in the case where a distance on surface between the adjacent terminal metals is set to be relatively great, it is possible to restrain the terminal metals from causing a short circuit, even if water adheres to the terminal metals. However, a current demand for downsizing a connector for a board is likely to set a pitch between the adjacent terminal metals to be a relatively small. Consequently, the distance on surface between the adjacent terminal metals is likely to be set relatively small. Thus, there is a fear that the adjacent terminal metals will cause a short circuit.

In view of the above problems, an object of the present invention is to provide a connector for a board that can restrain adjacent terminal metals from causing a short circuit and an electrical junction box that utilizes the connector for the board.

A connector for a board in accordance with an embodiment of the present invention comprises: a connector housing including a hood section adapted to be coupled to a mating connector; an inner wall disposed on an inner part of the hood section of the connector housing and provided with a plurality of through-holes; and a plurality of terminal metals inserted into the through-holes. An end of each of the terminal metals is inserted into each of the through-holes to be disposed in the hood section and the other end of each terminal metal is drawn out from each of the through-holes to be connected to a circuit board. The inner wall is provided in an outer surface with openings around the through-holes so that adjacent openings around the through-holes are shifted in a thickness direction of the inner wall.

Also, an electrical junction box in accordance with an embodiment of the present invention comprises: a casing; a circuit board contained in the casing; a connector housing disposed on the circuit board and including a hood section adapted to be coupled to a mating connector; an inner wall disposed on an inner part of the hood section of the connector housing and provided with a plurality of through-holes; and a plurality of terminal metals inserted into the through-holes. An end of each of the terminal metals is inserted into each of the through-holes to be disposed in the hood section and the other end of each terminal metal is drawn out from each of the through-holes to be connected to a circuit board. The inner wall is provided in an outer surface with openings around the through-holes so that adjacent openings around the through-holes are shifted in a thickness direction of the inner wall.

According to embodiments of the present invention, the openings around the adjacent through-holes are shifted in the thickness direction of the inner wall. Thus, it is possible to set a great distance on surface between the adjacent terminal metals inserted into the adjacent through-holes. Consequently, even if the water adheres to the terminal metals, it is possible to restrain the water from short-circuiting the adjacent terminal metals.

It is preferable that embodiments of a connector for a board and an electrical junction box provided with the connector for the board in accordance with the present invention have the following constructions.

The inner wall may be provided on the outer surface with stepped portions near both or one of the adjacent openings around the through-holes so that the openings are shifted in the thickness direction of the inner wall.

According to embodiments of the present invention, a great distance on surface between the terminal metals inserted into the adjacent through-holes can be obtained by the stepped portions.

The inner wall may be provided on the outer surface with stepped portions near only one of the adjacent openings around the through-holes.

According to the above construction, it is possible to simplify a structure of the connector housing in comparison with a case where the stepped portions are provided on the outer surface of the inner wall near both of the openings around the adjacent through-holes.

The stepped portion may be a protrusion that projects outward from the outer surface of the inner wall in the thickness direction of the inner wall.

According to the above construction, the water adhering to the protrusions flows down rapidly along the side surfaces of the protrusions. Thus, since it is possible to restrain the water from being accumulated between the protrusions, it is possible to further prevent the adjacent terminal metals from causing a short circuit.

The connector housing may be disposed on the circuit board so that the inner wall is disposed above the hood section, and the protrusion may be provided on a side surface with a downward slope.

According to the above construction, the water adhering to the protrusion is guided by the downward slope to readily flow away from the opening. Thus, since it is possible to restrain the water from being accumulated between the protrusions, it is possible to prevent the adjacent terminal metals from causing a short circuit.

According to embodiments of the present invention, it is possible to restrain the adjacent terminal metals from causing a short circuit.

DETAILED DESCRIPTION OF EMBODIMENTS

Referring now to FIGS. 1 to 7, an embodiment will be described below in which a connector 10 for a board (hereinafter referred to a "board connector") in accordance with the present invention is applied to an electrical junction box 11 for a motor vehicle. The board connector 10 is connected between a power source (not shown) such as a battery or on-vehicle electrical components (not shown) such as head lamps and wipers to switch on and off various kinds of on-vehicle electrical components.

Figure 1:
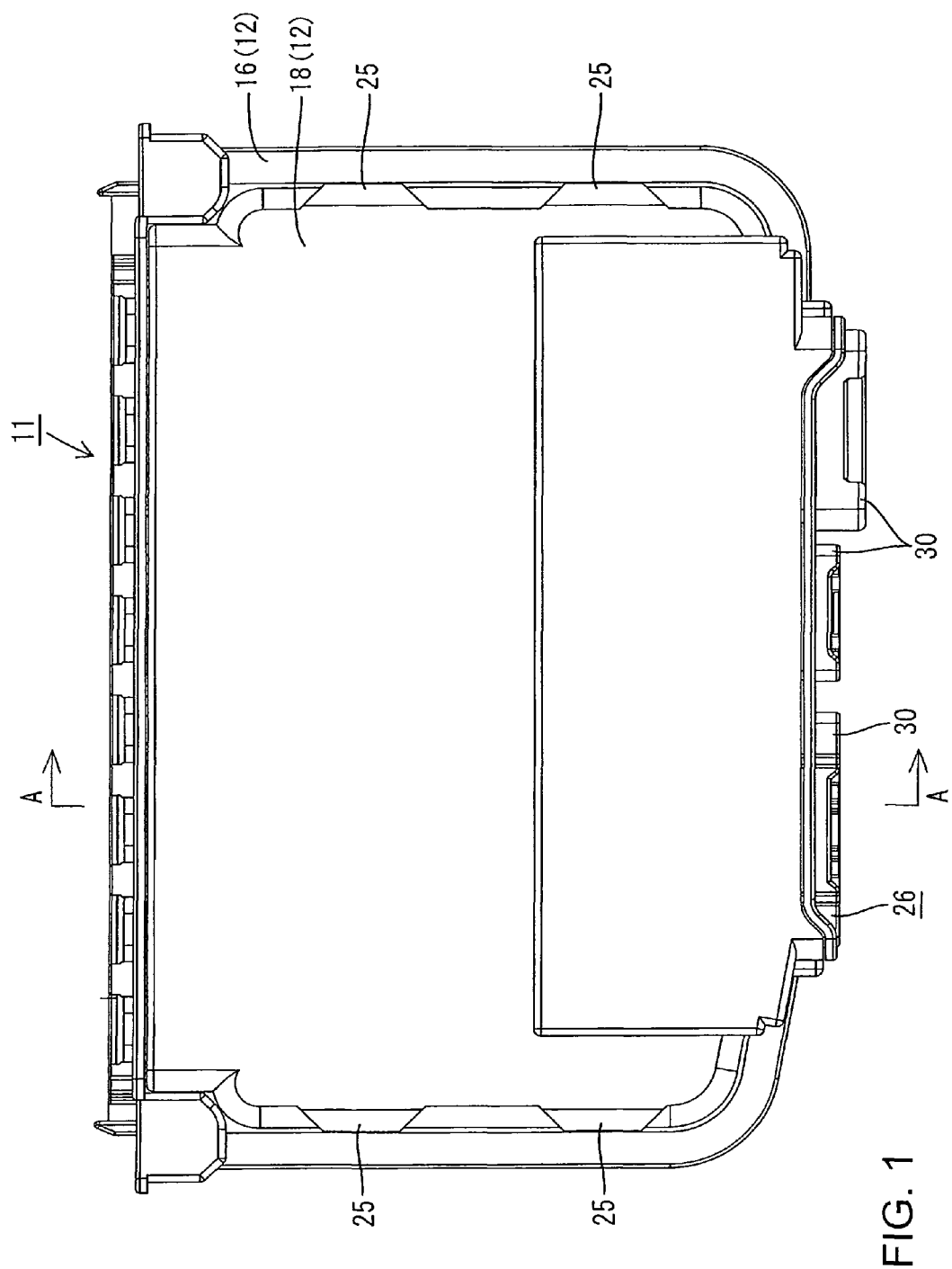
FIG. 1 is a front elevation view of an embodiment of an electrical junction box in accordance with the present invention.

In the description hereinafter, an upper side in FIG. 1 defines "an upper part or direction", a lower side in FIG. 1 defines "a lower part or direction". A right side in FIG. 1 defines "a right part or direction" and a left side in FIG. 1 defines "a left part or direction". A left side in FIG. 2 defines "a rear side" and a right side in FIG. 2 defines "a front side".

Figure 2:
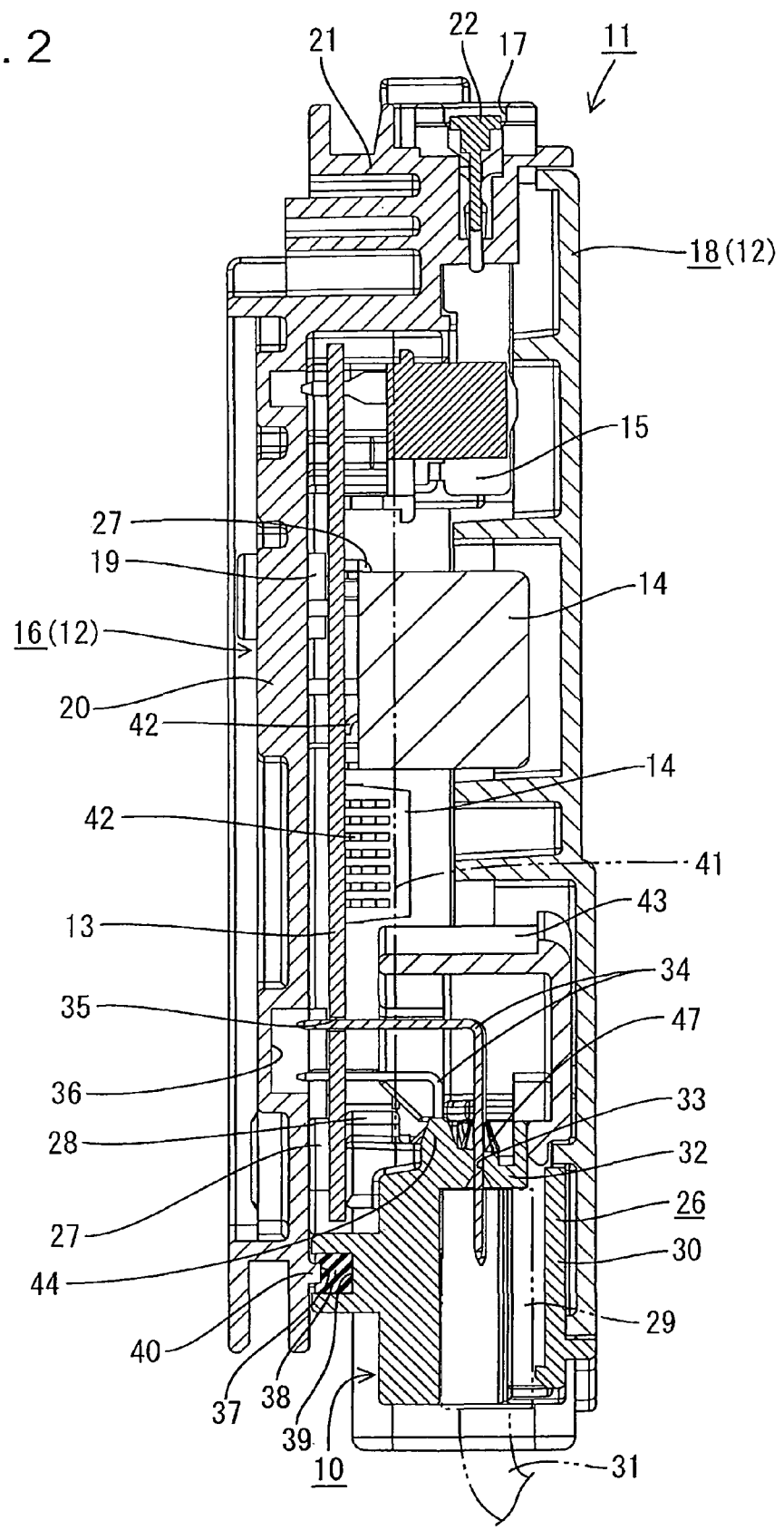
FIG. 2 is a cross section view of the electrical junction box taken along lines A-A in FIG. 1.
Figure 3:
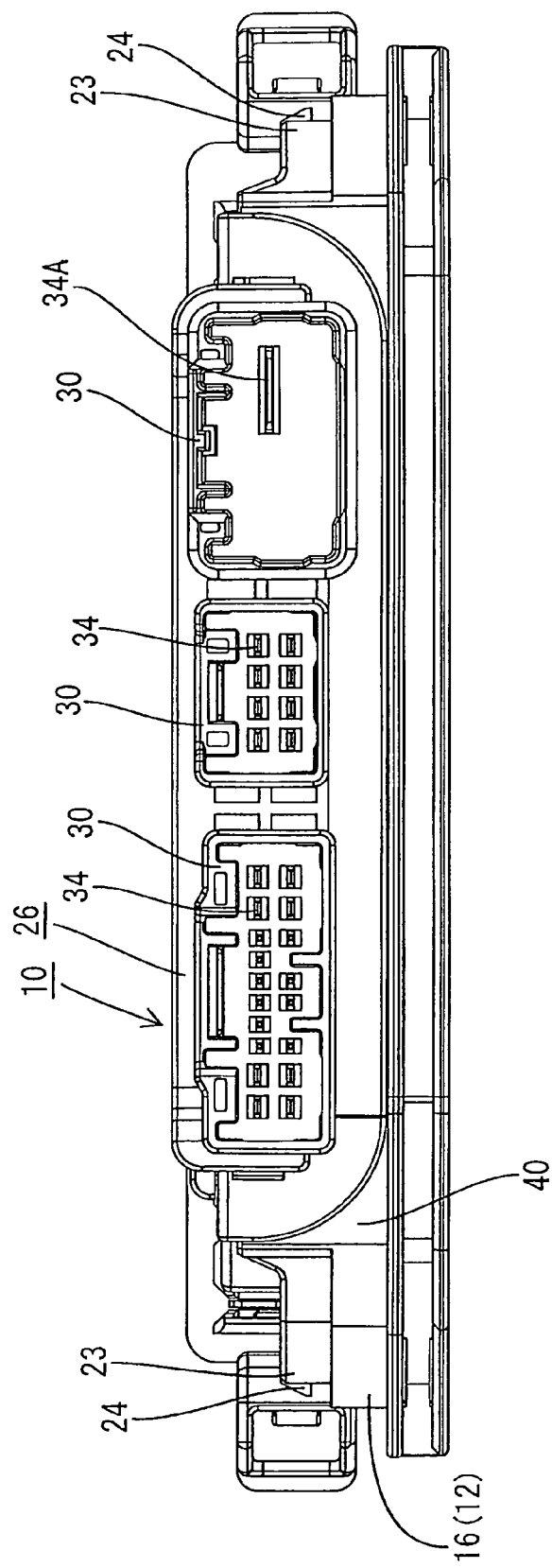
FIG. 3 is a bottom view of a connector for a board, illustrating the board from which a cover is removed.
Figure 4:
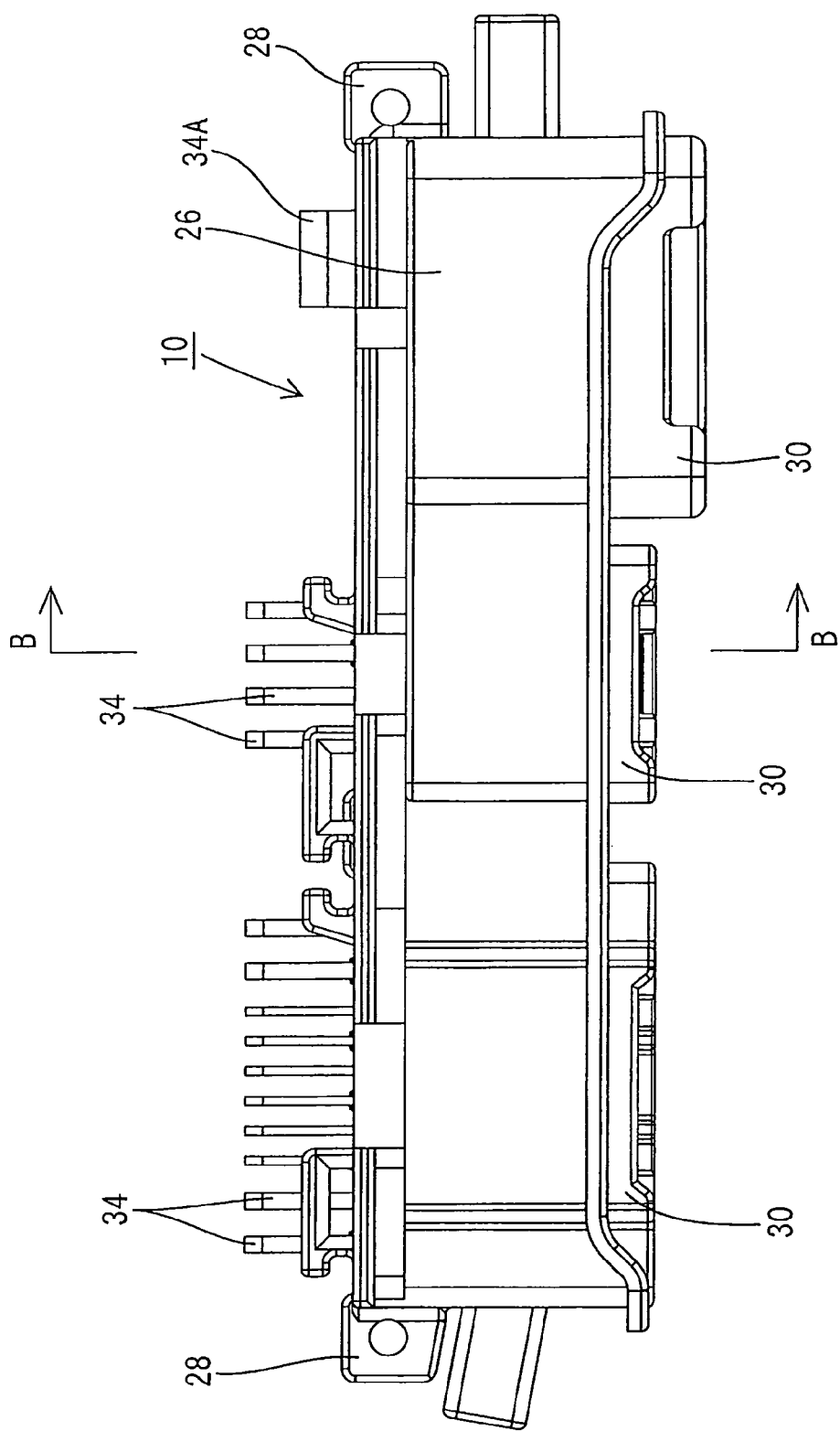
FIG. 4 is a front elevation view of a connector housing.

As shown in FIG. 2, the electrical junction box 11 contains a circuit board 13 in a flat casing 12. The circuit board 13 is provided on a surface with electrically conductive paths formed by means of a printed wiring technique. Electro components 14 are electrically connected to the electrically conductive paths by, for example, soldering. The thick film board may be formed by laminating a plurality of insulation boards on which the electrically conductive paths are formed.

The electrical junction box 11 is mounted on an engine compartment in a motor vehicle (not shown) so that the circuit board 13 stands up in a vertical direction, as shown in FIG. 2.

A plurality of fuse terminals 15 are disposed at a relatively upper end in FIG. 2 on the circuit board 13. The fuse terminals 15 are juxtaposed on the circuit board 13 laterally (in a direction perpendicular to the paper surface in FIG. 2). The fuse terminals 15 are formed by pressing a metal sheet. An end of each fuse terminal 15 passes each through-hole (not shown) in the circuit board 13 and electrically connected to the electrically conductive paths on the circuit board 13 by soldering.

The other end of each fuse terminal 15 extends upward in FIG. 2 and is disposed in a fuse-receiving section 17 of a casing body 16 described after.

As shown in FIG. 2, the casing 12 includes a casing body 16 made of a synthetic resin material and having an opening, and a cover 18 made of a synthetic resin material for closing the opening in the casing body 16. The casing body 16 is formed into a shallow container with respect to front and rear directions (right and left directions in FIG. 2).

The casing body 16 includes a rear wall 20 at the rear side of the electrical junction box 11. The casing body 16 is provided on the rear wall 20 with support bosses 19 that project toward a front side (a right side in FIG. 2) and support the circuit board 13 from a rear side (a left side in FIG. 2). The circuit board 13 is mounted on the front surfaces (right surfaces in FIG. 2) of the support bosses 23 and is spaced away from the rear wall 20 to be overlaid on the rear wall 20. The circuit board 13 and casing body 16 are secured to the support bosses 19 by screwing bolts 24 through the circuit board 13 to the support bosses 19.

The casing body 16 includes an upper wall 21 at the upper side. The casing body 16 is provided on the upper wall 21 with the fuse-receiving section 17 that is open upward (at an upper direction in FIG. 2). A fuse 22 can be mounted in the fuse-receiving section 17. The fuse 22 is inserted into the fuse-receiving section 17 to electrically couple the fuse 22 and fuse terminal 15 to each other.

The cover 18 is attached to the casing body 16, when a plurality of lock portions 24 (FIG. 3) provided on an outer side surface of each of a pair of right and left side walls 23 of the casing body 16 are elastically engaged with a plurality of lock-receiving portions 25 (FIG. 1) provided on positions corresponding to the lock portions 24 of the cover 18.

The board connector 10 is disposed at a relatively lower end with respect to the circuit board 13 in the casing 12 in FIG. 2. The board connector 10 includes an elongate connector housing 26 made of a synthetic resin material. As shown in FIG. 2, the connector housing 26 is provided with bolt-receiving portions 28 in which bolts 27 passing through the circuit board 13 from its rear side are screwed. When the bolts 27 are screwed in the bolt-receiving portions 28, the connector housing 26 is secured to the circuit board 13.

The connector housing 26 includes hood sections 30 which are open downward (to a lower direction in FIG. 2) and can be coupled to mating connectors 29. The mating connectors 29 are connected through wire harnesses 31 to the on-vehicle electrical components. An inner wall 32 of each hood section 30 at an upper position is provided with a plurality of through-holes 33 extending vertically (in a thickness direction of the inner wall 32). Terminal metals 34 pass the through-holes 33 in a pressing manner. Lower ends of the terminal metals 34 are disposed in each hood section 30. The plural terminal metals 34 are disposed in the connector housing 26. The terminal metals 34 are juxtaposed on a plurality of layers (two layers in the present embodiment) in the front and rear directions in FIG. 2 and are also juxtaposed in the right and left directions (in the right and left directions in FIG. 4). A terminal metal 34A for a power source to be connected to a battery is disposed at a relatively right side in FIG. 4 in the connector board 10 so that the terminal metal 34A is spaced away from the other terminal metals 34.

As shown in FIG. 2, an end of each terminal metal 34 passes the inner wall 32 and projects upward from the connector housing 26. The end is bent toward the circuit board 13 and inserted into each through-hole 35 in the circuit board 13 to be electrically connected to the electrically conductive paths on the circuit board 13 by soldering. The rear wall 20 of the casing body 16 is depressed toward the rear side and is provided with a clearance recess 36 that prevents the rear wall 20 from interfering with the terminal metals 34.

A lower wall 40 of the casing body 16 is depressed toward the rear wall 20 to form a receiving recess 37 for containing the connector housing 26. The connector housing 26 is contained in the receiving recess 37. The connector housing 26 is provided in a position opposed to the receiving recess 37 with a groove 39 for containing a packing 38. When the packing 38 is contained in the groove 39 and is brought into close contact with a clearance between an inner surface of the groove 39 and the receiving recess 37, a clearance between the casing body 16 and the connector housing 26 is sealed.

As shown by a two-dot chain line in FIG. 2, a seal member 41 made of, for example, a synthetic resin material is filled in a space enclosed by the connector housing 26 and the rear wall 20, upper wall 21, side wall 23, and lower wall 40 of the casing body 16. Since the seal member 41 covers a surface of the circuit board 13 and lead lines 42 of electronic parts 14, a waterproof function in the electrical junction box 11 can be maintained. The seal member 41 is filled into the clearance recess 36 in the casing body 16 and into a clearance between the circuit board 13 and the rear wall 20 of the casing body 16.

As shown in FIG. 2, the connector housing 26 is disposed on a bottom of the casing 12 so that the openings of the hood sections are directed downward.

A waterproof cover 43 formed individually from the casing 12 and made of a synthetic resin material is mounted on an upper part (an upper side in FIG. 2) of the connector housing 26. As shown in FIG. 2, when the waterproof cover 43 is attached to the connector housing 26, the waterproof cover 43 covers the terminal metals 34 at an upper side (at an upper side in FIG. 2) and a front side (at a right side in FIG. 2). An end edge of the waterproof cover 43 at the side of the circuit board 13 is embedded in the seal member 41.

Figure 5:
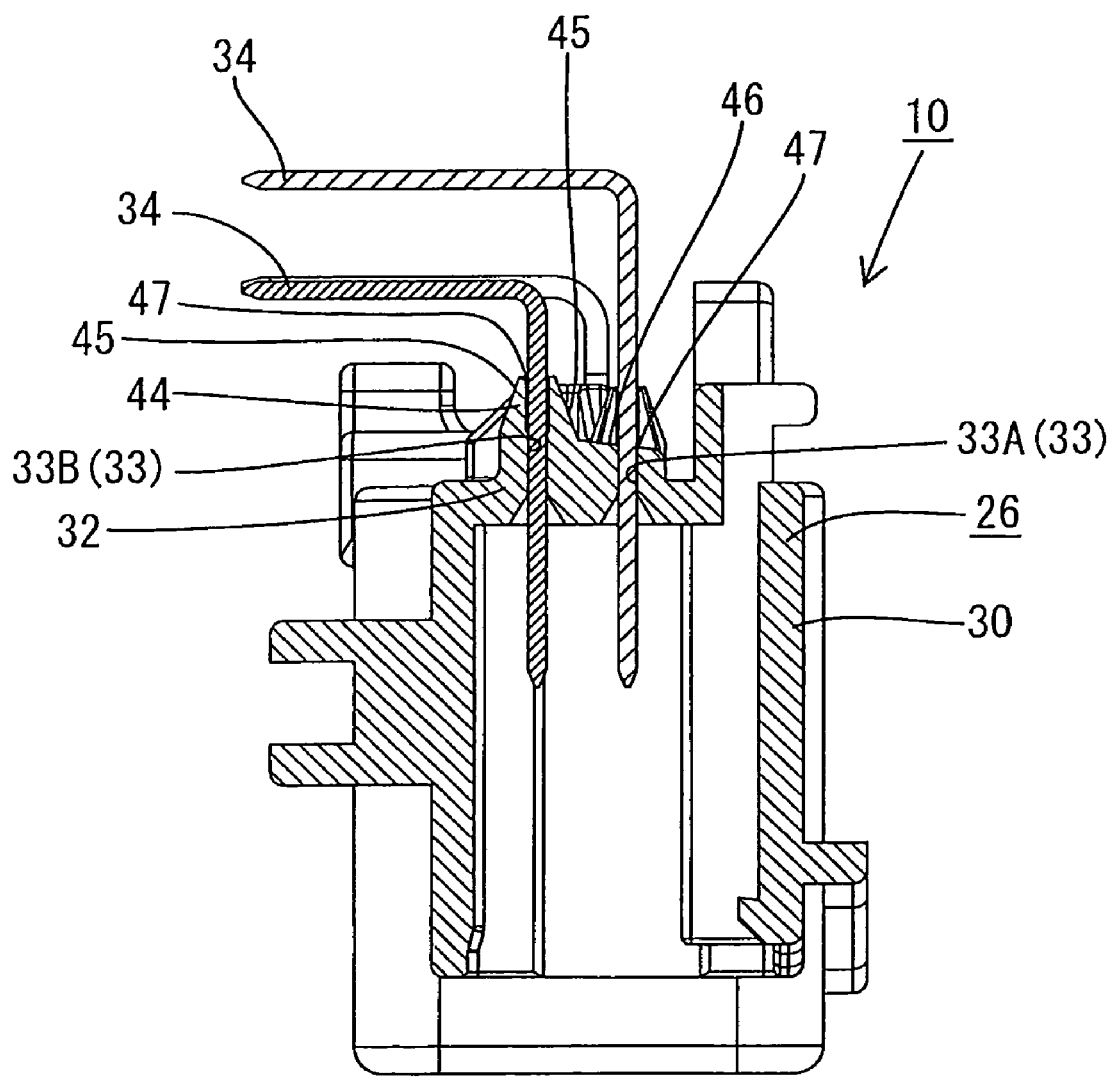
FIG. 5 is a cross section view of the connector housing taken along lines B-B in FIG. 4.

The terminal metals 34 are inserted into front side through-holes 33A at a front side in FIG. 5 (at a right side) in the vertical direction (in the thickness direction of the inner wall 32). Also, the terminal metals 34 are inserted into rear side through-holes 33B adjacent the front side through-holes 33A at a rear side in FIG. 5 (at a left side) in the vertical direction.

Protrusions (corresponding to stepped portions) 44 are formed on outer surfaces (upper surfaces in FIG. 5) of the inner walls 32 near openings 47 around the rear side through-holes 33B. Each protrusion 44 projects outward in the thickness direction (upward in FIG. 2) of the inner wall 32. The openings 47 around the adjacent front side through-holes 33A are shifted from the openings 47 around the rear side through-holes 33B in the thickness direction of the inner wall 32 (in a vertical direction in FIG. 5) by the protrusions 44. The openings 47 around the rear side through-holes 33B are provided on upper ends (projecting ends) of the protrusions 44. In the present embodiment, the openings 47 around the rear side through-holes 33B project outward more than the openings 47 around the front side through-holes 33A in the thickness direction of each inner wall 32 (in a vertical direction in FIG. 5).

Each protrusion 44 is provided on each side surface with a first downward slope (corresponding to an inclined surface) 45 inclined downward from each opening 47.

Figure 6:
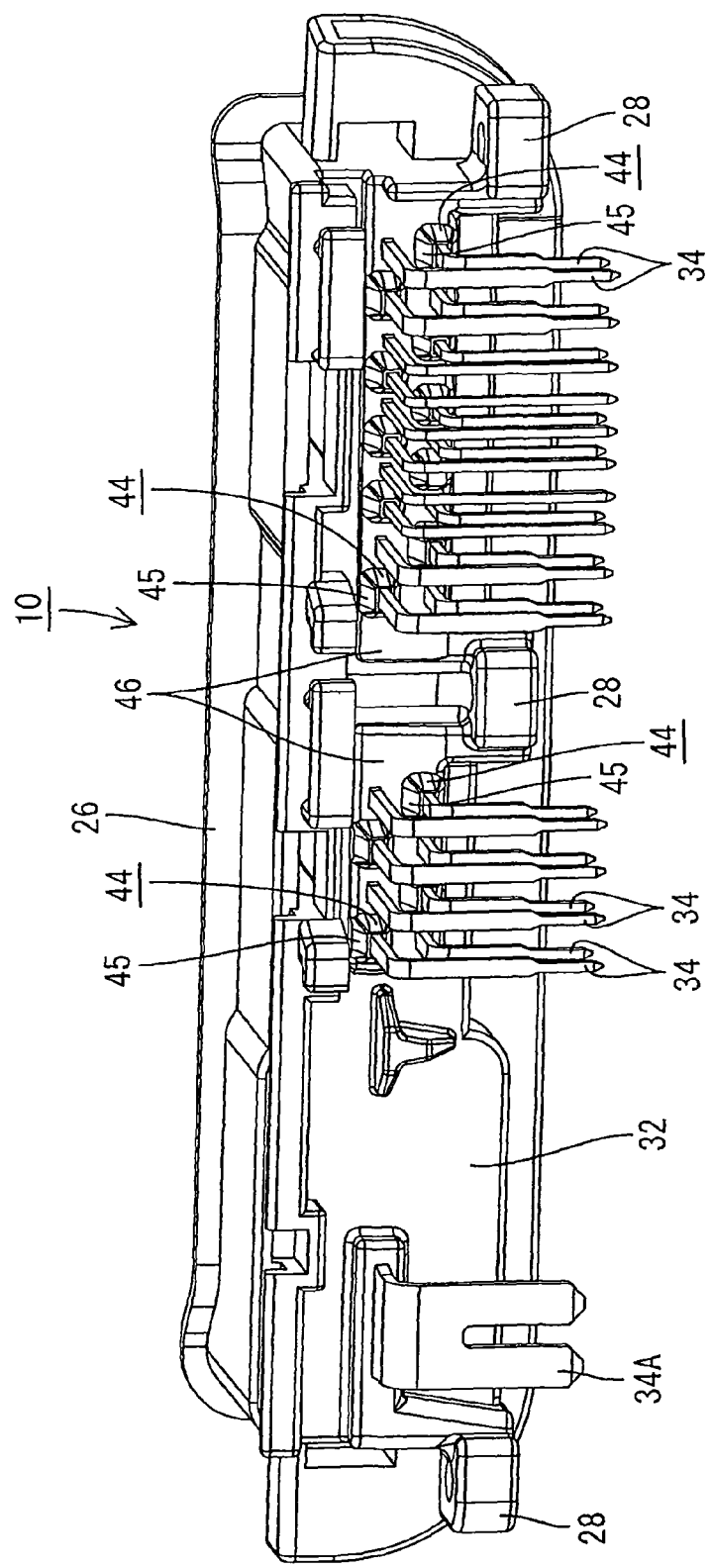
FIG. 6 is a perspective view of the connector housing.
Figure 7:
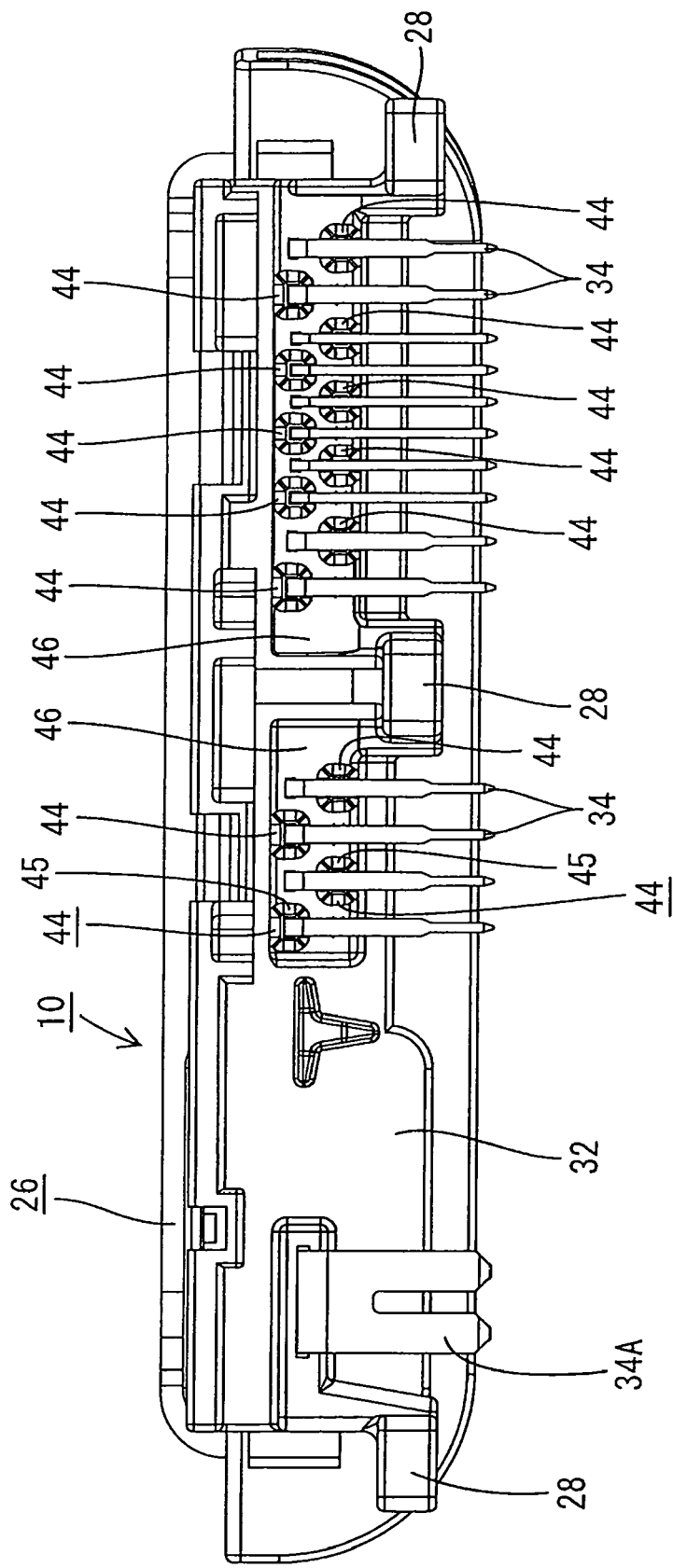
FIG. 7 is a plan view of the connector housing.

As shown in FIGS. 6 and 7, the protrusions 44 and openings 47 around the through-holes 33 are staggered in recesses 46 in front and rear directions (upper and lower directions in FIG. 7) and in right and left directions (right and left directions in FIG. 7).

As shown in FIG. 5, each through-hole 33 is formed in an area on an outer surface of the inner wall 32 and the area is generally inclined downward to the front side to define a second downward slope 46.

Next, an operation and effects of the present embodiment will be described below. The electrical junction box 11 of the present embodiment is mounted on an engine compartment in a motor vehicle. Consequently, there is a possibility that water will enter the casing 12 through, for example, the fuse-receiving section 17 upon rainfalls or vehicle-washing. Also, a temperature in the engine compartment is equal to an outdoor air temperature during a stopping mode of a motor vehicle, but the temperature in the engine compartment will be extremely higher than the outdoor air temperature during a running mode of the motor vehicle due to a heat from an engine. Consequently, since a difference in temperature between the stopping mode and the running mode becomes great, condensation may occur in the casing 12.

The water entering the casing 12 or the water condensed in the casing 12 flows downward in the casing 12. The waterproof cover 43 is disposed in the casing 12 above the terminal metals 34 arranged in the connector housing 26. Thus, the water that enters the casing 12 through the fuse-receiving section 17 is received on the waterproof cover 43 to prevent the water from adhering to the terminal metals 34.

However, for example, the water condensed within the waterproof cover 43 may flow in the waterproof cover 43, may reach the upper surfaces of the inner walls 32 of the connector housing 26, and may bridge and adhere to the adjacent terminal metals 34.

Since an electrical resistance between the adjacent terminal metals 34 becomes relatively great in the case where a distance on surface between the adjacent terminal metals is set to be relatively great, it is possible to restrain the terminal metals 34 from causing a short circuit, even if water adheres to the terminal metals 34. However, a current demand for downsizing the board connector 10 is likely to set a pitch between the adjacent terminal metals 34 to be a relatively small. Consequently, the distance on surface between the adjacent terminal metals 34 is likely to be set relatively small. Thus, there is a fear that the adjacent terminal metals 34 will cause a short circuit.

In view of the above problems, in the present embodiment, each inner wall 32 is provided on the outer surface with protrusions 44 projecting outward in the thickness direction of the inner wall 32, thereby shifting the openings around the adjacent through-holes 33 in the thickness direction of each inner wall 32. Thus, even if the pitch between the adjacent terminal metals 34 is set to be relatively small, it is possible to set a great distance on surface between the adjacent terminal metals 34 inserted into the adjacent through-holes 33. Consequently, even if the water adheres to the terminal metals 34, it is possible to restrain the water from short-circuiting the adjacent terminal metals 34.

For example, in the case where each protrusion 44 is provided near the openings 47 around the adjacent through-holes 33, there is a fear that water will be accumulated between the adjacent protrusions 44. Since each protrusion 44 is provided near the one of the openings 47 around the adjacent through-holes 33 in the outer surface of each inner wall 32 in the present embodiment, it is possible to restrain the water from being accumulated between the adjacent protrusions 44. Thus, it is possible to further prevent the adjacent terminal metals 34 from causing a short circuit.

Furthermore, according to the present embodiment, the water adhering to the protrusions 44 flows down rapidly along the side surfaces of the protrusions 44. Thus, since it is possible to restrain the water from being accumulated between the protrusions 44, it is possible to further prevent the adjacent terminal metals from causing a short circuit.

In addition, according to the present embodiment, the connector housing 26 is disposed on the circuit board 13 so that the inner walls 32 are arranged above the hood sections 30, and the downward slope is provided on the side surfaces of each protrusion 44. Thus, the water adhering to the protrusions 44 is guided by the downward slope to readily flow away from the openings 47. Thus, since it is possible to restrain the water from being accumulated between the protrusions 44, it is possible to prevent the adjacent terminal metals from causing a short circuit.

The water flowing from the protrusions 44 to the inner walls 32 of the connector housing 26 flows down along the second downward slopes 46 on the outer surfaces of the inner walls 32 and is drained out from the area where the through-holes 33 are provided in the inner walls 32. Thus, it is possible to further prevent the adjacent terminal metals from causing a short circuit.

According to the present embodiment, since each protrusion 44 is provided on the outer surface of each inner wall 32 near only the one of the openings 47 around the adjacent through-holes 33, it is possible to simplify a structure of the connector housing 26 in comparison with a case where the stepped portions are provided on the outer surface of the inner walls 32 near both openings 47 around the adjacent through-holes 33.

It should be noted that the present invention is not limited to the embodiment described above and illustrated in the drawings. For example, the following embodiments will fall in the technical scope of the present invention.

(1) Although the stepped portions are the protrusions 44 projecting outward from the outer surface of each inner wall 32 in the thickness direction of the inner wall 32 in the present embodiment, the present invention is not limited to this embodiment. The stepped portions may be recesses depressed from the outer surface of each inner wall 32 in the thickness direction of the inner wall 32.

(2) Although the protrusion 44 is provided near the one of the openings 47 around the adjacent through-holes 33 in the present embodiment, the present invention is not limited to this embodiment. The protrusions 44 may be provided near the both openings 47 around the adjacent through-holes 33.

In this case, the protrusions 44 may be provided near the both openings 47 around the adjacent through-holes 33 and recesses may be provided near the both openings 47 around the adjacent through-holes 33. Furthermore, the protrusion 44 may be provided on the one of the openings 47 around the adjacent through-holes 33 while the recess may be provided on the other of the openings 47 around the adjacent through-holes.

(3) Although the first downward slopes 45 are formed on the side surfaces of each protrusion 44 in the present embodiment, the present invention is not limited to this embodiment. The protrusion 44 may be formed into a cylindrical configuration.

(4) Although the connector housing 26 is disposed in the casing 12 so that each inner wall 32 is disposed above each hood section 30 in the present embodiment, the present invention is not limited to this embodiment. The hood section 30 may take any position. For example, the hood section may be positioned to be open at the side.

(5) Although the terminal metals 34 are juxtaposed on two layers in the front and rear directions in the present embodiment, the present invention is not limited to this embodiment. The terminal metals 34 may be arranged on one layer or juxtaposed on three layers.

(6) Although the electrical junction box 11 is mounted in the engine compartment of the motor vehicle in the present embodiment, the present invention is not limited to this embodiment. The electrical junction box 11 may be mounted in any place in the motor vehicle.

What is claimed is:

1. A connector for a board comprising:
   a connector housing including a hood section adapted to be coupled to a mating connector;
   an inner wall disposed on an inner part of said hood section of said connector housing and provided with a plurality of through-holes; and
   a plurality of terminal metals inserted into said through-holes, an end of each of said terminal metals being inserted into each of said through-holes to be disposed in said hood section and the other end of each terminal metal being drawn out from each of said through-holes to be connected to a circuit board; and
   a plurality of protrusions extending outwardly from said inner wall, said protrusions being fewer in number than said through-holes, every other through-hole in a row of the through-holes being surrounded by one of the protrusions, and the through-holes in between the protrusions not being surrounded by protrusions, the protrusions of one row being offset with respect to protrusions of an adjacent row such that the protrusions of both rows are staggered, the protrusions being in a recess that is defined by walls that exist at front, rear, right and left sides of the protrusions.

2. A connector for a board according to claim 1, wherein said connector housing is disposed on said circuit board so that said inner wall is disposed above said hood section, and said protrusion is provided on a side surface with a downward slope.

3. A connector for a board according to claim 1, wherein said connector housing is disposed on said circuit board so that said inner wall is disposed above said hood section, and said protrusion is provided on a side surface with a downward slope.

4. A connector for a board according to claim 1, wherein the protrusion is formed in a cylindrical configuration.

5. A connector for a board according to claim 1, wherein the protrusion is formed in a cylindrical configuration.

6. A connector for a board according to claim 1, wherein the protrusion is formed in a pyramidal configuration.

7. A connector for a board according to claim 1, wherein the protrusion is formed in a pyramidal configuration.

8. A connector for a board according to claim 1, wherein said at least one protrusion extends outwardly from said inner wall at an angle, having a flat section surrounding the terminal metal that is narrower in width than a diameter of the terminal metal, and the angled surface extending outwardly from said inner wall and the flat section form an edge at a point where the flat section and the angled surface join.

9. An electrical junction box comprising:
   a casing;
   a circuit board contained in said casing;
   a connector housing disposed on said circuit board and including a hood section adapted to be coupled to a mating connector;
   an inner wall disposed on an inner part of said hood section of said connector housing and provided with a plurality of through-holes; and
   a plurality of terminal metals inserted into said through-holes, an end of each of said terminal metals being inserted into each of said through-holes to be disposed in said hood section and the other end of each terminal metal being drawn out from each of said through-holes to be connected to a circuit board; and
   a plurality of protrusions extending outwardly from said inner wall, said protrusions being fewer in number than said through-holes, every other through-hole in a row of the through-holes being surrounded by one of the protrusions, and the through-holes in between the protrusions not being surrounded by protrusions, the protrusions of one row being offset with respect to protrusions of an adjacent row such that the protrusions of both rows are staggered, the protrusions being in a recess that is defined by walls that exist at front, rear, right and left sides of the protrusions.

10. An electrical junction box according to claim 9, wherein said connector housing is disposed on said circuit board so that said inner wall is disposed above said hood section, and said protrusion is provided on a side surface with a downward slope.

11. An electrical junction box according to claim 9, wherein said connector housing is disposed on said circuit board so that said inner wall is disposed above said hood section, and said protrusion is provided on a side surface with a downward slope.

12. An electrical junction box according to claim 9, wherein said at least one protrusion extends outwardly from said inner wall at an angle, having a flat section surrounding the terminal metal that is narrower in width than a diameter of the terminal metal, and the angled surface extending outwardly from said inner wall and the flat section form an edge at a point where the flat section and the angled surface join.

* * * * *